United States Patent [19]

Lombardo et al.

[11] 4,100,312
[45] Jul. 11, 1978

[54] METHOD OF MAKING METAL-PLASTIC LAMINATES

[75] Inventors: Michael S. Lombardo, Waterbury; Elaine F. Jacovich, Cheshire; Eugene D. D'Ottavio, Thomaston; John J. Grunwald, New Haven, all of Conn.

[73] Assignee: MacDermid Incorporated, Waterbury, Conn.

[21] Appl. No.: 747,071

[22] Filed: Dec. 2, 1976

Related U.S. Application Data

[63] Continuation of Ser. No. 629,911, Nov. 7, 1975, abandoned, which is a continuation of Ser. No. 303,369, Nov. 3, 1972, abandoned.

[51] Int. Cl.$^2$ .................. B05D 5/12; B32B 15/08
[52] U.S. Cl. .................................. 427/96; 156/630; 156/665; 156/901; 427/98; 427/307; 428/418; 428/447; 428/450; 428/901
[58] Field of Search ............... 428/418, 447, 450, 457, 428/901, 266, 155; 427/98, 307, 92, 96, 99; 148/6.27; 134/41; 156/3, 247, 312, 323, 630, 634, 625, 665

[56] References Cited

U.S. PATENT DOCUMENTS

| | | | |
|---|---|---|---|
| 3,445,326 | 5/1969 | Hurst | 428/450 |
| 3,585,103 | 6/1971 | Thomson | 428/266 |
| 3,619,246 | 11/1971 | Bragole | 428/422 |
| 3,620,933 | 11/1971 | Grunwald et al. | 156/3 |
| 3,640,829 | 2/1972 | Elton | 428/306 |
| 3,753,932 | 8/1973 | Jenkins | 260/2.5 |
| 3,808,028 | 4/1974 | Lando | 427/92 |
| 3,846,168 | 11/1974 | Elmore | 427/98 |
| 3,903,326 | 9/1975 | Mikesell | 427/98 |

FOREIGN PATENT DOCUMENTS 1,011,125   4/1964   United Kingdom .................. 156/329

*Primary Examiner*—George F. Lesmes
*Assistant Examiner*—P. J. Thibodeau
*Attorney, Agent, or Firm*—St.Onge, Mayers, Steward & Reens

[57] ABSTRACT

An improvement is obtained in the bond strength between members of a laminate comprising a plastic substrate and a metal film through a process of first laminating to the plastic substrate a thin, sacrificial, anodized metal foil while providing at the interface prior to laminating of the foil to the plastic at least a mono molecular film of an organic silicon compound. After laminating the treated metal foil to the substrate under heat and pressure, the foil is chemically stripped from the substrate, leaving a surface of improved receptivity for conventional electroless plating and electroplating procedures, or other metallizing techniques. The final metal film when applied to the substrate exhibits consistently better adhesive strength than is obtained without the organic silicon treatment of the interface, especially in respect to adhesive strength at elevated temperature.

11 Claims, 1 Drawing Figure

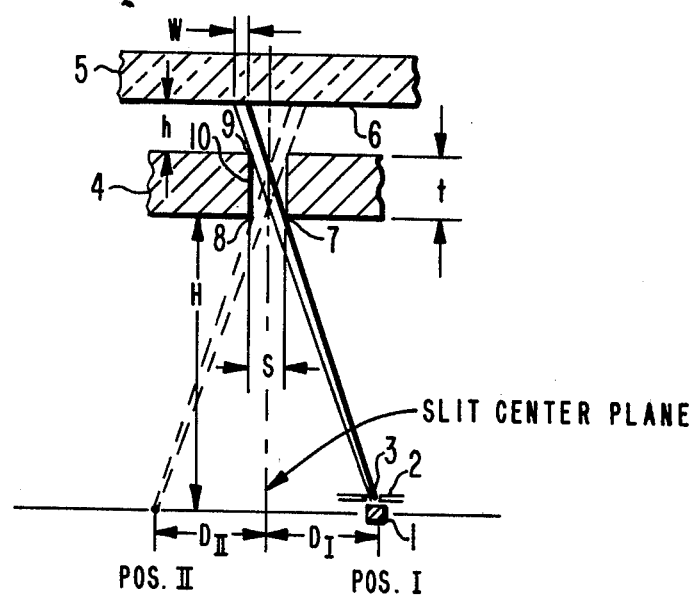

METHOD OF MAKING METAL-PLASTIC LAMINATES

RELATED APPLICATIONS

This application is a continuation of copending U.S. application Ser. No. 629,911, filed Nov. 7, 1975, now abandoned, which was in turn a continuation of U.S. application Ser. No. 303,369, filed Nov. 3, 1972, now also abandoned.

BACKGROUND OF THE INVENTION

This invention relates to a method of preparing a plastic substrate to improve the characteristics of its surface for the bonding thereto of a subsequently applied metal film, such as an electrolessly deposited metal film. This invention relates to both an improved laminate comprising a plastic substrate and metal film, as well as to the substrate itself, useful especially in the production of "additive" circuit boards for electrical and electronic equipment.

The method here disclosed is generally similar to that described in U.S. Pat. Nos. 3,620,933 and 3,666,549, in that initially a sacrificial metal foil is bonded by heat and pressure to a surface of the polymer substrate which is ultimately to be metal plated or otherwise metallized. The sacrificial metal foil is chemically stripped or dissolved from the surface of the substrate, after which the permanent metal film is deposited by known techniques. Application of the sacrificial foil to, and subsequent chemical stripping of it from, the plastic surface produces a microporous topography on the substrate surface that provides improved bonding characteristics for electrolessly plated metal film.

This invention is directed to the improvement in the foregoing procedure obtained by combining with the processing steps previously taught, a treatment of the interface formed by the plastic substrate and initial or sacrificial metal foil to provide thereat what is believed to be a molecular film, or at least microscopic amounts, of an organic silicon compound. The treatment to provide such silicon compound at the interface is accomplished before lamination of the foil to the plastic, and generally it is preferred to accomplish this by immersing the anodized metal foil, or otherwise coating it, in a solution of the organic silicon compound. The improvement obtained by this step is evidenced not only in greater bonding or peel strength between the substrate and final metal film, but more especially in greater retention of such bonding strength after exposure of the laminate to elevated temperature during soldering.

One of the main requirements of printed circuits in general, and additive circuits in particular, is that they must exhibit strong bonding of the metal coating to the plastic substrate. The industry has adopted a minimum requirement of approximately 8 pounds per linear inch for adhesion between the conductor metal and the plastic substrate. Along with this is the further important requirement in a satisfactory printed circuit that the metal-to-polymer bond be stable at elevated temperatures up to around 500° to 550° F. Indeed, printed circuit boards as mass produced today are subjected to soldering operations designed to permanently mount the various electronic components that constitute the electrical circuit. Quite frequently, such soldering operation involves partially dipping the circuit board in a bath of molten solder in order to effect soldering of all junctions in one step. This represents a substantial thermal shock to the laminate. It is imperative, therefore, that such soldering operations not weaken the metal-to-polymer bond below the industry specification of minimum bond strength.

It has been found during extensive experimentation that many occasions arise where printed circuit boards show excellent metal-to-polymer adhesion at room temperature, but that a dramatic decrease or deterioration results because of soldering or other high temperature processing operations.

In the prior art there has also been some problem of criticality in anodizing the sacrificial metal foil, and in the time, temperature and pressure conditions employed in laminating the anodized foil to the substrate, in order to achieve consistent results on a commercial basis in respect to peel strength in the finished laminate.

It is accordingly an objective of the present invention to provide a method of producing consistently higher peel strengths between the metal conductor film and plastic substrate, to be able to do this over a wider range of operating conditions in the preparation of the laminate and thus provide greater tolerance for variables which inherently and unavoidably arise under commercial production operations, and especially to materially improve the thermal shock resistance of the final laminate product.

As noted briefly above, it has now been found that applying to the anodized sacrificial metal foil, prior to lamination of it to the substrate, a "film" of a suitable silicon derivative, more especially an organic silicon derivative of the class comprising the amino alkanoxy substituted silanes, one can substantially improve the adhesion of the conductor metal to the substrate both before and after soldering. The silicon derivatives can be applied by both aqueous and non-aqueous solutions. The concentration of the silicon derivatives in solution can be quite small, indicating that no more than perhaps a monomolecular layer is retained on the sacrificial metal foil prior to lamination. Surprisingly, it appears that the silicon derivative in its mono layer form is so tenaciously held at the plastic-metal interface that its effect is not diminished or destroyed in the process of laminating the metal to the polymer substrate or in the subsequent chemical stripping step.

The mechanism by which the silicon derivative exerts its favorable reaction is not well understood. It is somehow thought perhaps to be incorporated during lamination into the polymer surface and to protect this from degradation during soldering operations. Another possible mechanism could involve a direct bond between the electrolessly deposited metal, such as copper or nickel, and the silicon. Such metal-silicon bond is perhaps more durable than the bond of the metal to the substrate surface directly. Thus, one could visualize the electrolessly deposited metal as bonding to the silicon, and the silicon then bonding to the polymer substrate, in a bridging type of arrangement. A still further possibility for the mechanism of improved bond between the deposited metal and plastic substrate may be postulated on the basis of improved wetting or flow that is caused by the thin film of silicon derivative retained on the surface of the sacrificial metal prior to laminating. Indeed, improved flow of the plastic substrate into the microscopic crevices or capilliaries of the anodized sacrificial metal foil during lamination will result in closer reproduction of the intricate topography of that anodized surface by the plastic surface, thereby providing a more intimately interlocking contact, after the sacrificial metal has been chemically stripped, between the substrate and a subsequently deposited metal film.

Silicon derivatives, and silanes in particular, have been widely used in industry to promote the physical properties of various "filled" polymers. Filled polymers are made by blending into the polymer during its molding operation particles of titanium dioxide, asbestos, sand and other solids. Silanes have been used to promote the wetting of the solid particles with the polymer during the molding operation, thereby avoiding de-wetting or separation of the plastic from the filler material during mechanical stress. There are numerous references in the literature relating to the use of silicon derivatives or reactive silanes in various interfacial applications. One excellent reference is entitled "Reactive Silanes as Adhesion Promoters to Hydrophilic Surfaces," by Edmund P. Plueddenann, published by Dow Corning Corporation, Midland, Mich. So far as is now known, however, there has been no previous suggestion for the use of such silane materials in a sort of "transfer" type of process mechanism such as that apparently involved in this invention, wherein the silane is provided prior to lamination at the interface of metal-plastic members of a laminate structure, where this metal member is subsequently stripped away to better condition the plastic surface for selective metallization by an additive process such as electroless metal plating. It is a surprising feature of this invention that the effect of the silane derivative on the plastic surface exerts itself even after the sacrificial metal has been stripped off chemically. In other words, it would seem that the plastic surface directly adjacent to the sacrificial metal film is somehow "permanently modified" by the silane, and its action remains effective to improve adherence of the final metal film additively deposited on the surface of the substrate.

A wide variety of organic silicon derivatives is available but apparently not all are useful in the practice of the invention herein disclosed. The best results are obtained by use of silane-type materials, and more particularly there is preferred for commercial practice of the invention a rather specific type of silane having the general formula:

R . Si(R$_1$)$_3$ wherein R is a lower alkyl (up to 6 carbons) amino substituted radical, and R$_1$ is a lower alkanoxy (up to 3 carbons) radical.

The following examples illustrate the invention but it is understood that these are not to be considered as comprehensive of all silicon derivatives useful in the practice of the invention.

EXAMPLE 1

A glass-epoxy aluminum foil laminate is first prepared by a method similar to that described in U.S. Pat. No. 3,620,933, Example I. This comprises taking a sheet of aluminum foil of approximately 2 mil thickness and immersing it in an alkaline soak cleaner bath for 5 minutes at a temperature of around 190° F to remove surface grime and oil. The clean aluminum foil is then preferably etched slightly in ammonium bifluoride solution at room temperature for 3 minutes preliminary to anodic treatment in an electrolytic bath containing phosphoric acid (10% by volume) at 115°-120° F for about 3 minutes at a current density of 25-30 A.S.F.

The anodized aluminum foil is placed in a solution of N-beta-(aminoethyl)-gamma-aminopropyl trimethoxy silane in isopropanol for about 3 minutes at room temperature. The concentration of the silane is 4 ml/l in this solution. The foil is then dried for about 2 minutes at 300° F and laminated to a plastic substrate.

The substrate consists of stacked plies (e.g., eight in number) of glass fiber reinforced epoxy B-stage resin (for example Precision No. 1528) and the composite of resin and foil is placed in a laminating press using a release strip, such as a sheet of cellophane, between the aluminum foil and platten in order to prevent sticking during the curing operation. The laminating press is preheated to a temperature of around 350° F, is then closed and the laminate components are preheated at a pressure of about 5 p.s.i. for 30 seconds, after which the pressure is raised to 250 p.s.i. and the curing is continued at that same temperature and pressure for about 15 minutes. The resulting laminate is a hard, infusible resin substrate having the aluminum foil permanently adhered to its surface.

This aluminum clad laminate is optionally cleaned of any surface grime and is immersed, sprayed or otherwise contacted with an etchant solution capable of dissolving away all visible traces of the aluminum foil. As described in Example VII of the aforesaid U.S. Pat. No. 3,620,933, any of the usually employed aluminum etchant solutions, such as hydrochloric acid (10%-40% by volume), or alkali metal hydroxide (5%-20% by weight), is effective. Typical treatment conditions comprise a solution temperature of 80° to about 180° F, preferably about 100°-130° F, for a period of 2 to 30 minutes, but normally about 5 minutes at the prefered temperature. When the substrate is free of aluminum foil, it is dipped in an aqueous phosphoric acid bath containing 50% by volume of phosphoric acid, for about 7 minutes at 160°-170° F, after which it is again thoroughly water rinsed.

The substrate is now ready for metal plating. In this example the procedure employed is the so-called one-step activation technique described in U.S. Pat. No. 3,523,518, Example I. This comprises immersing the substrate in a palladium-stannous-chloride hydrosol activator solution, prepared in accordance with the teaching of the aforesaid patent, for about 3 minutes at room temperature; carefully rinsing and then immersing the substrate in an accelerating solution of fluoroboric acid; rinsing again and placing the substrate in a commercial electroless copper plating solution (e.g., "Metex 9030," MacDermid Incorporated, Waterbury, Conn., or equivalent) for a period of about 20 minutes at room temperature; and finally rinsing and electroplating an additional copper deposit to a thickness of about 1 mil. The plated substrate is dried and then subjected to an oven bake at 300° F for about 1 hour. The adhesion of the plated metal deposit to the plastic substrate of this sample was checked by the standard technique of measuring the pull of a 1-inch wide strip of metal peeled from the surface and pulled at 90° to that surface. The average adhesion value was found to be 20-22 pounds per inch.

A small sample of the same plated board was floated for 10 seconds on the surface of a solder pot filled with solder at a temperature of 510°-530° F. After cooling, the adhesion test gave a value of 15-18 pounds per inch.

For purposes of comparison, a second plated board is prepared using identically the same procedure described above except that the step of immersing the anodized aluminum foil in the silane bath is omitted.

The adhesion of this is found to be about 3–4 pounds per inch before thermal shock test, and 1–3 pounds after such test.

EXAMPLE 2

In order to test what effect variations in anodizing time of the sacrificial aluminum foil have on the ultimate metal film adhesion value, the above-described procedure is duplicated in all respects except for length of anodization and, in certain cases, omission of the silane treatment. The results of such tests are shown in the following table.

Table No. 1

| Anodizing Time - Min. | Silane Treatment | Copper Electroless Plate Adhesion Values - #/in. | |
|---|---|---|---|
| | | Before T.S.* | After T.S.* |
| 1 | No | 1 – 2 | 0 – 1 |
| 1 | Yes | 14 – 16 | 12 – 15 |
| 2 | No | 4 – 6 | 3 – 4 |
| 2 | Yes | 15 – 19 | 13 – 14 |
| 3 | No | 3 – 4 | 1 – 3 |
| 3 | Yes | 20 – 22 | 15 – 18 |

*T.S. Thermal Shock Test 10 seconds in molten solder 510°–530° F

EXAMPLE 3

The foregoing series of tests is repeated, but in this instance the substrate is electrolessly plated with nickel instead of copper, using a commercial electroless nickel ("Metex 9340," MacDermid Incorporated). The electroless nickel is over-plated with electrolytic acid copper to provide a copper deposit of approximately 1 mil, as before. The results of the tests on this series of panels are as follows:

Table No. 2

| Anodizing Time - Min. | Silane Treatment | Nickel Electroless Plate Adhesion Values - #/in. | |
|---|---|---|---|
| | | Before T.S.* | After T.S.* |
| 1 | No | 13 – 14 | 6 – 8 |
| 1 | Yes | 12 – 13 | 11 – 12 |
| 2 | No | 22 – 26 | 12 – 16 |
| 2 | Yes | 22 – 23 | 13 – 14 |
| 3 | No | 22 – 24 | 10 – 16 |
| 3 | Yes | 22 – 24 | 14 – 16 |

EXAMPLE 4

Again the same series of tests as performed in Example 2 above (copper electroless plate) is duplicated, but in this instance the silane treatment consists of immersing the anodized aluminum in an aqueous rather than an isopropyl alcohol solution of the same silane compound, at the same concentration (4 ml/l) as before. The results of peel strength tests obtained are as follows:

Table No. 3

| Anodizing Time - Min. | Silane Treatment | Copper Electroless Plate Adhesion Values - #/in. | |
|---|---|---|---|
| | | Before T.S.* | After T.S.* |
| 1 | No | 1 – 2 | 0 – 1 |
| 1 | Yes | 12 – 13 | 13 – 14 |
| 2 | No | 4 – 6 | 3 – 4 |
| 2 | Yes | 14 – 20 | 13 – 16 |
| 3 | No | 3 – 4 | 1 – 3 |
| 3 | Yes | 16 – 18 | 13 – 16 |

EXAMPLE 5

Again the same series of tests is run as in Example 3 employing an electroless nickel deposit over-plated with copper. The results of the tests are as follows:

Table No. 4

| Anodizing Time - Min. | Silane Treatment | Nickel Electroless Plate Adhesion Values - #/in. | |
|---|---|---|---|
| | | Before T.S.* | After T.S.* |
| 1 | No | 13 – 14 | 6 – 8 |
| 1 | Yes | 14 – 19 | 16 – 17 |
| 2 | No | 22 – 26 | 12 – 16 |
| 2 | Yes | 26 – 28 | 17 – 19 |
| 3 | No | 22 – 24 | 10 – 16 |
| 3 | Yes | 22 – 30 | 16 – 18 |

EXAMPLE 6

In order to determine the effect of concentration of silane on the adhesion results, a further series of tests is run following the identical procedure described in Example 2 above but varying the concentration of silane and the annodizing time. The results recorded are as follows:

Table No. 5

| Anodizing Time - Min. | Silane Concentration ml/l in H$_2$O | Electroless Copper Plate Adhesion Values - #/in. | |
|---|---|---|---|
| | | Before T.S.* | After T.S.* |
| 1 | 4 | 10 – 11 | 9 – 10 |
| 2 | 4 | 11 – 13 | 11 – 16 |
| 3 | 4 | 9 – 12 | 9 – 12 |
| 1 | 3 | 10 – 14 | 10 – 14 |
| 2 | 3 | 12 – 15 | 10 – 14 |
| 3 | 3 | 12 – 15 | 12 – 15 |
| 1 | 2 | 9 – 10 | 9 – 10 |
| 2 | 2 | 10 – 12 | 12 – 15 |
| 3 | 2 | 14 – 16 | 12 – 14 |
| 1 | 1 | 10 – 11 | 10 – 11 |
| 2 | 1 | 10 – 12 | 8 – 10 |
| 3 | 1 | 14 – 17 | 10 – 13 |

EXAMPLE 7

The results tabulated below show that certain silanes are much more effective than others in producing improvement in plated metal adhesion. The tests are conducted exactly as before, changing only the silane used (but not its concentration which remains 4 ml/l in aqueous solution). From this it clearly appears that all silanes are not equally effective, and in fact some definitely detract from the adhesion of the metal to the substrate. The chemical identification of the several silanes tested is as follows:

Silane A — vinyl-tris(beta methoxyethoxy)silane
$CH_2 = CHSi(OCH_2CH_2OCH_3)_3$

B — gamma-methacryloxy propyltrimethoxy silane
$CH_2 = C - C - OCH_2CH_2CH_2Si(OCH_3)_3$ $CH_3$ $O$ C — gamma-glycidoxypropyl trimethoxy silane
$CH_2 - CHCH_2OCH_2CH_2CH_2Si(OCH_3)_3$ $O$ D — gamma-aminopropyltrimethoxy silane
$NH_2CH_2CH_2CH_2Si(OCH_3)_3$ E — N-beta-(aminoethyl)-gamma-aminopropyltrimethoxy silane
$NH_2CH_2CH_2NHCH_2CH_2CH_2Si(OCH_3)_3$ The data below also includes results where no silane treatment is employed.

Table No. 6

| Anodizing Time - Min. | Silane Treatment | Electroless Copper Plate Adhesion Values - #/in. | |
|---|---|---|---|
| | | Before T.S.* | After T.S.* |
| 1 | — | 1 – 2 | 1 |
| | A | 2 | 0 |
| | B | 2 | 0 |
| | C | 0 | 0 |
| | D | 8 – 10 | 2 – 3 |
| | E | 14 – 16 | 12 – 13 |

Table No. 6-continued

| Anodizing Time - Min. | Silane Treatment | Electroless Copper Plate | |
|---|---|---|---|
| | | Adhesion Values - #/in. | |
| | | Before T.S.* | After T.S.* |
| 2 | — | 4 – 6 | 3 – 4 |
| | A | 3 | 2 – 3 |
| | B | 2 – 3 | 2 – 3 |
| | C | 3 – 4 | 3 – 4 |
| | D | 10 – 12 | 4 – 6 |
| | E | 15 – 19 | 13 – 14 |
| 3 | — | 3 – 4 | 3 |
| | A | 2 | 1 – 3 |
| | B | 3 | 2 – 3 |
| | C | 3 – 5 | 3 |
| | D | 18 – 20 | 3 – 5 |
| | E | 20 – 22 | 15 – 18 |

Table No. 7

| Anodizing Time - Min. | Silane Treatment | Electroless Nickel Plate | |
|---|---|---|---|
| | | Adhesion Values - #/in. | |
| | | Before T.S.* | After T.S.* |
| 1 | — | 13 – 14 | 6 – 8 |
| | A | 6 – 8 | 4 – 5 |
| | B | 7 – 8 | 6 |
| | C | 4 – 5 | 3 – 4 |
| | D | 6 – 8 | 4 – 7 |
| | E | 12 – 13 | 11 – 12 |
| 2 | — | 22 – 26 | 12 – 16 |
| | A | 21 – 25 | 14 – 17 |
| | B | 16 – 19 | 12 – 18 |
| | C | 22 – 24 | 14 – 18 |
| | D | 22 – 26 | 14 – 17 |
| | E | 22 – 23 | 13 – 14 |
| 3 | — | 22 – 24 | 10 – 16 |
| | A | 16 – 18 | 11 – 14 |
| | B | 16 – 19 | 10 – 13 |
| | C | 20 – 22 | 12 – 14 |
| | D | 16 – 18 | 12 – 17 |
| | E | 22 – 24 | 14 – 16 |

EXAMPLE 8

The same test procedure is followed using a sulfuric acid anodized aluminum foil, followed by treatment with Silane E, lamination, chemical stripping and final electroless plating, with all conditions the same as in Example 1 except for anodization. This consists in immersing the cleaned aluminum foil in an anodizing bath containing 15% (volume) sulfuric acid at 115°–120° F and using a current density of 17-20 A.S.F for the times indicated in the following table.

Table No. 8

| Anodizing Time - Min. | Silane Treatment | Electroless Copper Plate | |
|---|---|---|---|
| | | Adhesion Values - #/in. | |
| | | Before T.S.* | After T.S.* |
| 5 | No | 0 | 0 |
| | Yes | 7 – 8 | 6 – 8 |
| 6 | No | 0 | 0 |
| | Yes | 7 | 6 – 7 |

Similar improvement is obtained for electroless nickel plated substrates.

It appears from the foregoing that a more significant improvement in electroless plated metal-to-plastic bond strength resulting from the presence of a suitable silane at the metal-polymer interface is obtained in the case of electroless copper than is found in the case of electroless nickel. A possible explanation for this may lie in the fact that electroless nickel is inherently more chemical or corrosion resistant than electroless copper, hence the effect is less pronounced for the nickel.

The examples above involve introducing the silane at the metal-polymer interface by means of an immersion of the substrate polymer in a solution of the silane. It appears that other procedures are possible for introducing the silane prior to or during the lamination of sacrificial metal to the plastic substrate. Thus, for example, the silane may be incorporated in the resin mix prior to sheeting. Metallization procedures other than electroless plating may also be employed, as for example vacuum metal deposition.

What is claimed is:

1. The method of producing a final laminate of a self-supported plastic substrate and a permanent metal film covering at least a part of the surface of said substrate, which comprises the steps of forming an initial laminate of the plastic substrate and a sacrificial, temporarily applied, anodized aluminum foil, wherein the interface between such aluminum foil and substrate is treated prior to lamination to provide an organic silicon compound at such interface, said silicon compound being a silane of the general formula $R \cdot Si(R_1)_3$, wherein R is a lower alkyl amino substituted radical and $R_1$ is a lower alkanoxy radical, then bonding said substrate and aluminum foil together under heat and pressure to form said initial laminate, chemically stripping said aluminum foil from the initial laminate thus formed, and then metallizing at least a part of the stripped surface of the substrate to provide said final laminate.

2. The method as defined in claim 1, wherein said sacrificial aluminum foil is treated, prior to lamination, with said organic silicon compound by contacting said foil with a solution containing said compound.

3. The method as defined in claim 2, wherein said plastic substrate is a glass epoxy resin.

4. The method as defined in claim 1, wherein said aluminum foil is anodized in phosphoric acid solution.

5. The method as defined in claim 1, wherein said aluminum foil is anodized in sulfuric acid solution.

6. The method of producing a plastic substrate having improved surface characteristics for the ultimate bonding thereto of a permanent metal film, which comprises the steps of treating the surface of an anodized aluminum foil with a silane having the general formula:

$$R \cdot Si(R_1)_3$$

where R is a lower alkylamino substituted radical and $R_1$ is a lower alkanoxy radical; laminating said treated metal foil to said substrate under heat and pressure to provide an initial laminate of said substrate and aluminum foil, and then dissolving said aluminum foil from said substrate.

7. The method as defined in claim 6, wherein said anodized metal foil is immersed in an aqueous solution of a silane selected from the group consisting of aminopropyltriethoxy silane and aminoethylaminopropyl trimethoxy silane.

8. The method defined in claim 7, wherein said silane solution contains from about 0.5 ml to 5 ml per liter of said silane.

9. The method defined in claim 8 wherein the immersion time of said foil in said silane solution is from 30 seconds to 5 minutes at room temperature, and the foil is then dried for 1-2 minutes at about 300° F.

10. The method defined in claim 9, wherein the concentration of said silane is from about 0.5 ml to 5.0 ml per liter of solution.

11. The method defined in claim 5, wherein said anodized metal foil is immersed in an isopropyl alcohol solution of a silane selected from the group consisting of aminopropyltriethoxy silane and aminoethylaminopropyl trimethoxy silane.

* * * * *

UNITED STATES PATENT OFFICE
CERTIFICATE OF CORRECTION

Patent No. 4,100,312  Dated July 11, 1978

Inventor(s) Michael S. Lombardo, Elaine F. Jacovich, Eugene D. D'Ottavio and John J. Grunwald It is certified that error appears in the above-identified patent and that said Letters Patent are hereby corrected as shown below:

The drawing and the reference to it at the end of the Abstract in Patent No. 4,100,312 as issued have no relevance to this patent and should be deleted.

*Signed and Sealed this*

*Nineteenth* Day of *December 1978*

[SEAL]

Attest:

RUTH C. MASON
Attesting Officer

DONALD W. BANNER
Commissioner of Patents and Trademarks